United States Patent [19]

Tränkle et al.

[11] Patent Number: 5,179,731
[45] Date of Patent: Jan. 12, 1993

[54] FREQUENCY CONVERSION CIRCUIT

[75] Inventors: Günther Tränkle, Ney-Ulm; Gottfried Deckenbach, Blaustein, both of Fed. Rep. of Germany

[73] Assignee: Licentia-Patent-Verwaltungs-GmbH, Frankfurt, Fed. Rep. of Germany

[21] Appl. No.: 536,110

[22] Filed: Jun. 8, 1990

[30] Foreign Application Priority Data

Jun. 9, 1989 [DE] Fed. Rep. of Germany ....... 3918829
Mar. 27, 1990 [DE] Fed. Rep. of Germany ....... 4009784

[51] Int. Cl.$^5$ .......................... H04B 1/18; H04B 1/26; G01R 11/20
[52] U.S. Cl. .................................. 455/291; 455/304; 455/318; 455/324; 329/308; 329/336; 329/363; 307/512; 307/529
[58] Field of Search ................. 455/214, 313–316, 455/317–318, 319, 304, 323–324, 291; 332/123, 125; 329/308, 336, 346, 363; 307/512, 529; 328/155

[56] References Cited

U.S. PATENT DOCUMENTS

| | | | |
|---|---|---|---|
| 4,336,500 | 6/1982 | Attwood | 329/308 |
| 4,490,680 | 12/1984 | Goto | 455/214 |
| 4,574,244 | 3/1986 | Head | 329/308 |
| 4,682,117 | 7/1987 | Gibson | 455/214 |
| 4,905,307 | 2/1990 | Frank | 455/304 |
| 5,046,129 | 9/1991 | Short | 455/214 |

FOREIGN PATENT DOCUMENTS

| | | |
|---|---|---|
| 0048229 | 3/1982 | European Pat. Off. . |
| 0180339 | 5/1986 | European Pat. Off. . |
| 2645950 | 4/1977 | Fed. Rep. of Germany . |
| 2196195 | 4/1988 | United Kingdom . |

*Primary Examiner*—Reinhard J. Eisenzopf
*Assistant Examiner*—Andrew Faile
*Attorney, Agent, or Firm*—Spencer, Frank & Schneider

[57] ABSTRACT

A circuit array for frequency translation by means of quadrature heterodyne signals has very low quadrature errors even at very high frequencies and is monolithically integratable with little external circuitry. The circuit array includes a first mixer which receives a first portion of an input signal, a second mixer which receives a second portion of the input signal, and a heterodyne signal generator which receives a local oscillator signal and supplies quadrature heterodyne signals to the mixers. The heterodyne signal generator includes a control loop to ensure a 90° phase shift between the quadrature heterodyne signals. The circuit array can be used in a modulator for a transmitter or in a demodulator for a receiver.

11 Claims, 9 Drawing Sheets

FREQUENCY CONVERSION CIRCUIT

BACKGROUND OF THE INVENTION

The invention relates to a circuit for frequency translation, and more particularly to a circuit for translating a useful or input signal with a heterodyne signal using the principle of quadrature signal processing in a modulator or demodulator.

In modern communications and position-finding systems, an evaluation by amount and phase frequently takes place in the receiver. For computation of the phase information, orthogonal splitting of the receiver signal into an in-phase branch (I) and a quadrature branch (Q) is necessary. A circuit unit generating the two quadrature signals by a complex mixture with subsequent low-pass filtration is designated a quadrature or vector demodulator.

Digitalizable baseband signals are mostly generated from an intermediate frequency signal using the quadrature demodulator. In principle, however, the received signal can be translated in one step from a high frequency signal to the baseband by means of coherent or asynchronous direct mixing.

In a corresponding manner, the principle of quadrature signal processing is applied to generate a transmission signal from a useful signal and from a heterodyne signal in a modulator. Circuits for modulators and demodulators can be constructed using identical principles as regards their substantial aspects.

SUMMARY OF THE INVENTION

The object of the present invention is to provide an advantageous circuit array for frequency use in a modulator or demodulator. In particular, a frequency translation circuit of this type should meet the following requirements:

high image frequency suppression, i.e. minor quadrature errors and good amplitude matching;
minor phase errors even with distorted local oscillator (LO) signal;
high LO→RF isolation (prevents an offset arising from LO self-mixing in direct translation;
wide band compatibility;
low intermodulation and noise contribution;
high control dynamics in conjunction with DC-stable outputs and constant linearity properties;
low power requirement; and
little external circuitry.

DESCRIPTION OF THE PREFERRED EMBODIMENTS

Figure 1:
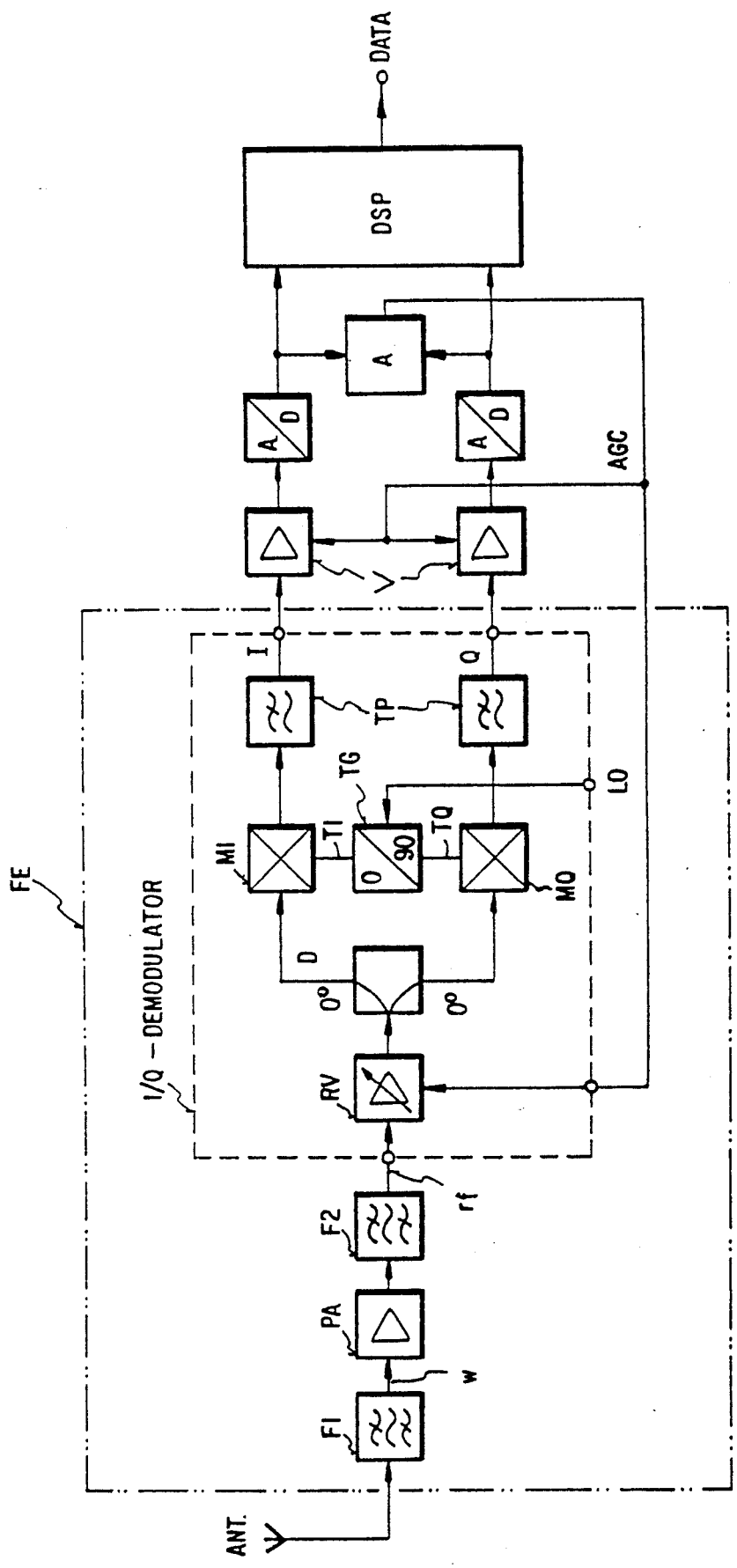
FIG. 1 shows the design principle of a direct-translating receiver.

FIG. 1 shows in simplified form, an input section (front end) FE of a receiver array for direct translation of a high-frequency data signal picked up by an antenna ANT into the baseband, and the subsequent recovery of the data, which are phase-modulated, for example.

The received signal w picked up by the antenna and filtered in a first filter F1 is amplified in a pre-amplifier PA and passed to the signal input port of a quadrature (I/QS) demodulator as a high-frequency signal rf after passing through a further filter F2 which might be provided.

The pre-filter F1 (to some extent F2 also) reduces the demands made on the active components of the front end F E for interference suppression and prevents reception at harmonics of the oscillator waves. The filter F2 is used if interference components arising in the amplifier PA (offset, harmonic distortions) have to be suppressed.

In the I/Q demodulator, the high-frequency input signal rf is amplified in by a controllable amplifier RV, distributed in by a splitting stage to two signal branches of identical phase, and translated by mixers MI, MQ with heterodyne signals TI, TQ. The heterodyne signals TI, TQ are derived by a heterodyne signal generator TG from an oscillator signal LO of a heterodyne oscillator and are phase-shifted in relation to one another by 90°. The components I and Q of the complex baseband signal are obtained from the mixer output signals by low-pass filters TP. Direct translation to the baseband particularly with coherent translation, has a number of substantial advantages over the Superhet principle, in which an intermediate frequency is employed in particular, the problem of image frequency suppression does not arise, and the main channel selection can be achieved in the baseband with monolithically integratable anti-aliasing low-pass filters and digital low-pass filters.

The complex baseband signal with components I and Q is again amplified and filtered in further controllable amplifiers V. After analog/digital conversion by converters A/D, the components I and Q are evaluated by a digital signal processor DSP to recover the data DATA. Using an amplitude detector A, it is possible to derive, from the sum of the squares of the two components, control signals for automatic gain control AGC of the controllable amplifiers RV and V.

Figure 2:
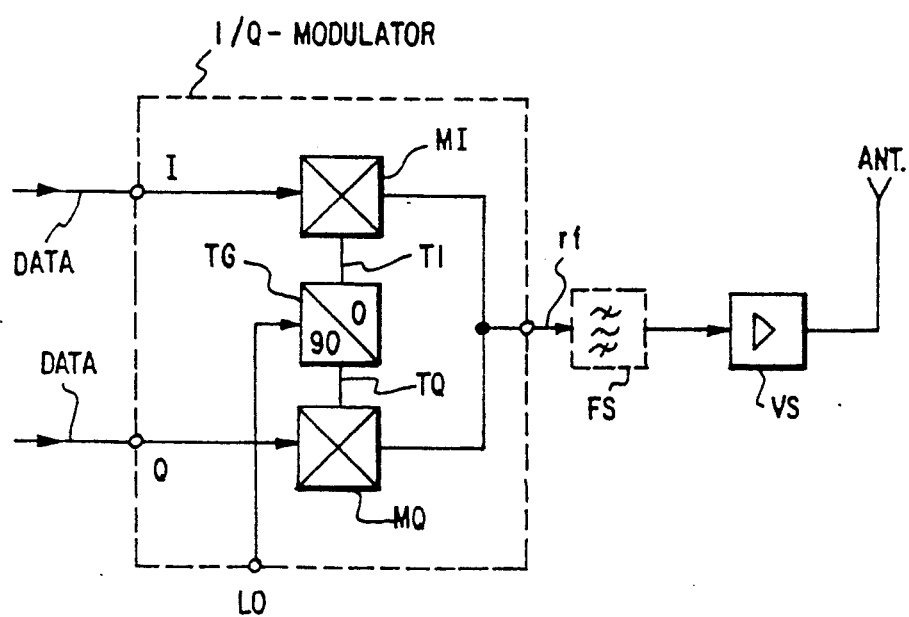
FIG. 2 shows the design principle of a transmission array.

In FIG. 2, a transmitter array with an I/Q modulator and with appropriately reversed signal direction is designed similarly to the receiver array shown in FIG. 1. The two orthogonal components I and Q of a low-frequency data signal DATA, present as a complex baseband input signal, are passed separately to the mixers MI and MQ respectively and are there translated with the orthogonal heterodyne signals TI and TQ respectively obtained from the oscillator signal LO by the heterodyne signal generator TG. The mixer output signals are combined to form a high-frequency output signal rf which is amplified by a transmission amplifier stage SV and emitted by the antenna ANT. A further filter stage FS can be provided between the mixer outputs and the transmission amplifier stage SV.

Figure 3:
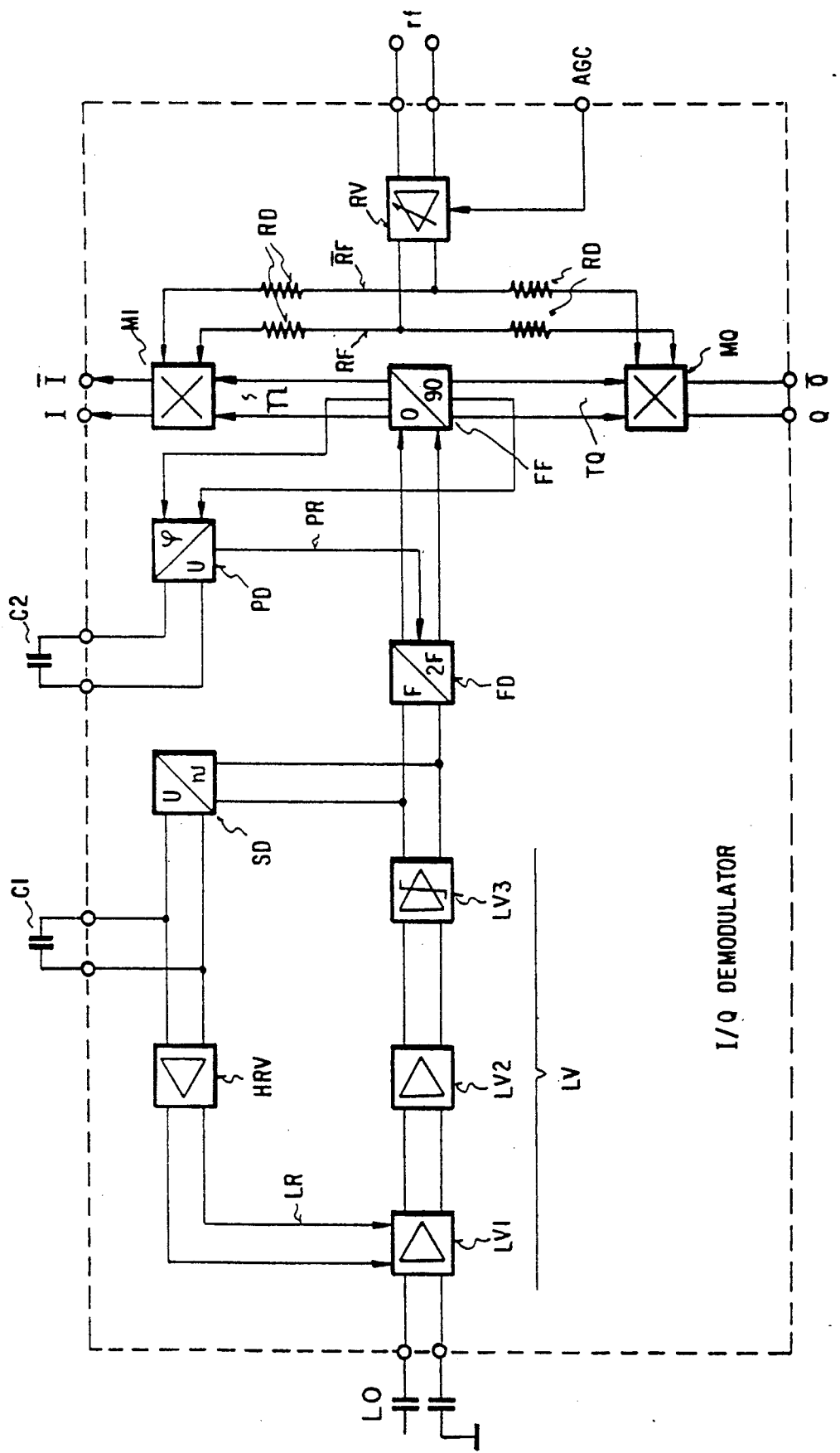
FIG. 3 shows a block diagram of a quadrature demodulator.

FIG. 3 shows a detailed block diagram of the quadrature demodulator in FIG. 1. The pre-amplified and, if necessary, filtered high-frequency input signal rf is supplied for the input of the controllable wide-band amplifier RV, whose gain can be set using the AGC loop already described for FIG. 1. The amplifier RV has two outputs at which the amplified high-frequency signal appears in the form of antiphase signal components RF, $\overline{RF}$. The two antiphase output signals are each split into two equal parts and fed to the two mixers MI, MQ.

The even split is represented in FIG. 3 by the identical resistors RD in the connections between mixers MI, MQ and amplifier RV. The mixer MI is operated by the heterodyne signal TI, the mixer MQ by the heterodyne signal TQ phase-shifted 90° to it. The push-pull output signals of the mixers are designated as I, $\overline{I}$ and Q, $\overline{Q}$ respectively.

In the heterodyne signals TI, TQ, which are preferably rectangular switching signals, precise maintenance of the mutual 90° phase shift and of the half-wave symmetry in the two heterodyne signals is of prime importance.

In this respect, the circuit according to FIG. 3 provides for an oscillator signal LO from a heterodyne oscillator to be processed in the I/Q demodulator to form the heterodyne signals TI, TQ, with no particularly high demands being placed on the heterodyne oscillator.

The oscillator signal LO is applied to the input of an amplifier array LV made up of several amplifier stages LV1, LV2, LV3, of which the last (LV3) is preferably adjusted to its upper limit.

The output signal of the last amplifier stage LV3 passes to a detector SD that continuously detects the keying ratio of the clipped output signal, and generates—when the keying ratio diverges from 0.5—a control signal LR using a control amplifier HRV for the first amplifier stage LV1. This control signal counters the non-symmetry, for example by a DC voltage level shift of the input or output signal of the first amplifier stage, as a result of which the switching time of the amplifier changes. The external capacitor C1 permits the control time constant of the control loop to be adjusted. The output signal of the last amplifier stage LV3, for which half-wave symmetry (keying ratio 0.5) is ensured by the control loop with SD and HRV, is applied to the input of a frequency doubling circuit FD that emits a double-frequency signal. With good half-wave symmetry of the signal at the input of frequency doubling circuit FD, the basic or fundamental wave in the output signal circuit of FD is very largely suppressed. The limitation of the signal by the amplifier is only an advantageous embodiment. The oscillator signal can also be amplified in linear form or only slightly clipped.

The frequency-doubled signal at the output of circuit FD passes to a masterslave D flip-flop FF connected for toggle operation. Flip-Flop FF acts as a frequency divider, so that the output signals TI, TQ of the flip-flop FF again have the same frequency as the oscillator signal LO. The flip-flop FF can be used as a phase splitter for generation of two 90° phase-shifted heterodyne signals TI, TQ when the output of the master stage supplies one heterodyne signal (TI), and the output of the slave stage supplies the other (TQ), as sketched out in FIG. 4. Because of dynamic effects, sufficient precision in the 90° phase shift between TI and TQ is not ensured without difficulty, particularly for very high frequencies. However, by using a phase detector PD to monitor the orthogonality of the heterodyne signals TI, TQ and to generate a control signal PR for the frequency doubling circuit FD in the event of divergences, it is possible to achieve in simple fashion an effective equalization of phase errors. The control signal PR can, for example, have the effect of shifting the DC voltage of the frequency-doubled signal, which has a high degree of fundamental wave freedom thanks to the limiting amplifier array LV in conjunction with the half-wave symmetry control loop (SD), thereby influencing the switching time of the flip-flop FF cycle switch. The control time constant of the phase control loop with phase end detector PD is determined using the external capacitor C2.

Figure 4:
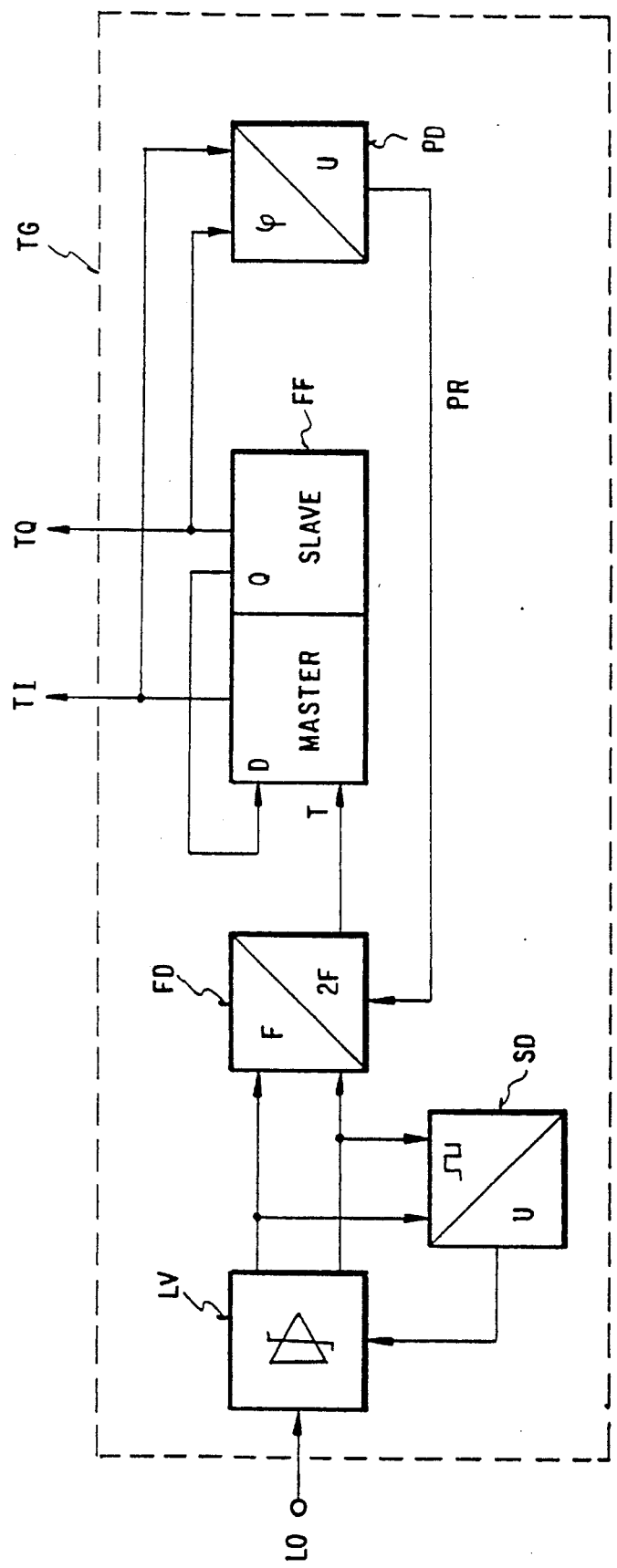
FIG. 4 shows a block diagram of a heterodyne signal generator for generation of orthogonal signals.

Although in FIG. 4 the control signal PR is derived from the output signals of the flip-flop FF a preferred embodiment provides for obtaining the control signal by a phase detector connected to the inputs of the phase-dividing flip-flop (or the outputs of the frequency doubling stage FD), as described in the following on the basis of FIG. 5.

The master-slave D flip-flop FF as such is shown in block P and its function is well known, so that the transistors in block P are not individually identified and the mode of operation of the various feedbacks is not described in detail. Other flip-flop circuits can be used in a similar fashion. The two 90° phase-shifted output signals TI and TQ are picked up at the master and slave outputs connected via load impedances $R_L$ to the supply potential +U.

Two switches T21, T22 or T23, T24 designed as differential amplifiers operate the master and slave stages, the inputs of these switches being subjected to the symmetrically supplied input signals e, e'. Appropriate inputs of the two differential amplifiers are connected to one another (base of T21 to base of T23; base of T22 to base of T24). Both differential amplifiers are fed from a joint current source S1. Thanks to the highly symmetrical design and the possibility with monolithic integration of making individual circuit elements of high precision with identical properties, no phase errors caused by the design of the flip-flop together with the switches and current source need be expected.

Phase errors do however occur when the keying ratio of the switches is ≠0.5, i.e. when the switching times are not equidistant in time. This is due to distortions of the input signal e, e' which are not to be avoided at acceptable expense, this signal being, on account of the 2:1 frequency divider effect of the flip-flop operated as a static phase splitter, the output signal T of the frequency doubler in the present instance.

If a keying ratio of 0.5 can be adjusted using a control loop, the required 90° phase position of the output voltage TI and TQ is also ensured.

A further switch (designed as a differential amplifier with transistors T25, T26) is provided for monitoring the keying ratio. This switch should have the same switching properties as switches T21, T22, and T23, T24, which can also be achieved in monolithic integration with high accuracy. The inputs of the further switch T25, T26 are directly connected to the appropriate inputs of the two other switches T21, T22, and T23, T24 and are therefore also subjected to the input signal e, e'. It is essential that the switching times of all switches tally precisely.

For further alignment of the dynamic properties of the further switch to those of the other switches, all switches are fed from the common current source S1.

A capacitor CF, together with load resistors RS, forms a lowpass filter for averaging the output voltage u, u' of the further switch is connected between the outputs of the further switch. The comparator CF T25, T26, which is connected via load resistors $R_S$ to the supply potential.

With a keying ratio differing from 0.5, e.g. with a longer modulating positive half-wave for e and shorter positive halfwave in the complementary signal e', one each of the two transistors of all three switches is open longer than the other, this being transistor T25 in the case of the further switch in the example, so that the averaged output voltage u is lower than u'.

The output voltages u, u' of the further switch T25, T26 are applied to the inputs of a control differential amplifier to increase the loop gain of the control loop and hence to reduce the phase residual error with transistors T27, T28. The current through the differential amplifier is determined by the current source S2. The outputs of the control differential amplifier are connected via load resistors $R_V$ to the supply potential +U. The output voltages are given as control voltage v, v'.

If u drops in relation to u', this leads to a greater increase in v and a corresponding drop in v'. The control voltages have a direct displacement effect on the DC voltage levels at the inputs of the switches (addition stages +), so that in the example an increase in v leads to a rise in the DC voltage level at the base of T26, which in its turn causes an extension of the modulating half-wave of e' and hence a longer opening time of transistor T26 and a drop in the voltage u, compared with u. The corresponding opposite reaction of a change in v' to u causes a rise in u and therefore counters the triggering drop in u. The control loop thus attempts to eliminate the voltage difference between u and u', which is equivalent to a 0.5 keying ratio or switching points which are equidistant in time. The control loop described is therefore able, with simple means, to ensure the 90° phase position in the output signals TI and TQ by adjusting the keying ratio in the switches.

Of course, it is also possible for the switches to be operated unsymmetrically by the input signal, in this case with one of the common control connections of the switches being at a constant potential. The control function is maintained in a corresponding manner.

Figure 5:
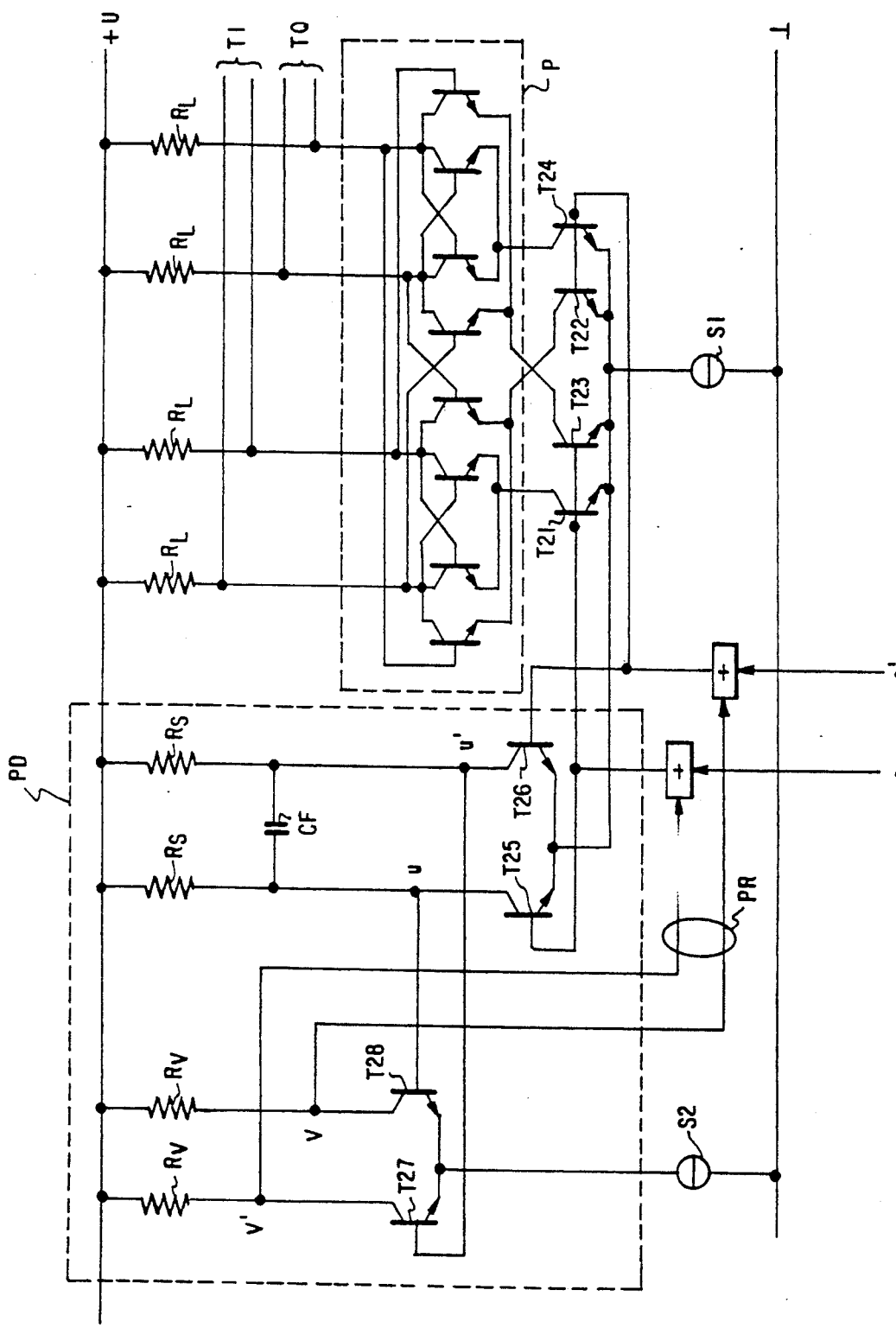
FIG. 5 shows a preferred embodiment of a generator for quadrature heterodyne signals.

The circuit shown in FIG. 5 takes advantage of the fact that when the switching times are precisely equidistant for the switches controlling the master and slave stages and subjected to the input signal, the 90° phase relationship is ensured in the output signals, so that by adjustment of the switching points to equidistance in time the required phase position is ensured and no longer needs to be checked.

The described control loop for the keying ratio at the input and the 90° phase shift at the output of the flip-flop operating as phase splitter is not only specifically usable in conjunction with a modulator or demodulator, but is also generally suitable for generation of two output signals with a defined phase relationship.

Figure 6:
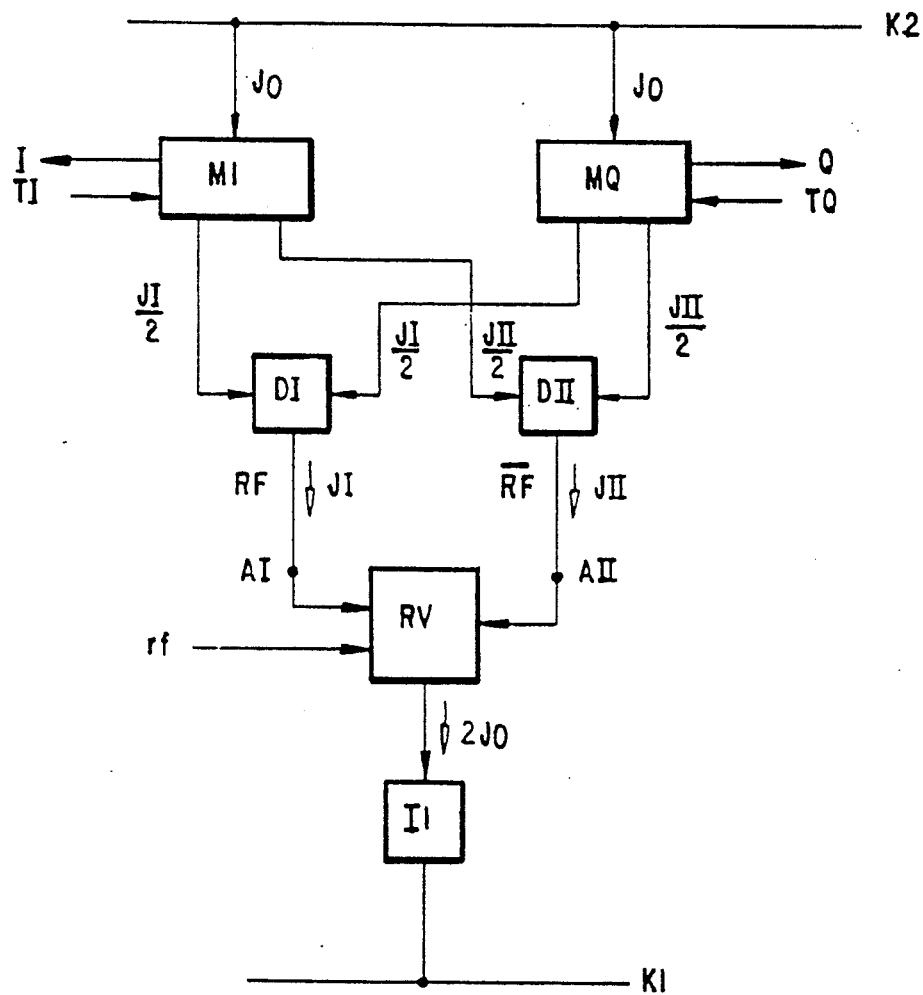
FIG. 6 shows a block diagram of a quadrature mixer array with a controllable voltage/current converter stage.

FIG. 6 shows an advantageously cascaded array of a controllable amplifier RV and mixers MI, MQ. K1, K2 are the designations of the supply voltage connections. The controllable amplifier RV is considered to contain as the input stage a negative-feedback differential amplifier stage as the voltage/current converter for the high-frequency signal rf. The quiescent current of the amplifier RV is determined by the constant current source I1 at $2J_O$. The amplifier RV contains additionally, without this being shown in detail, a control stage controlled by an AGC control signal and equipment for control-setting-independent stabilization of the quiescent currents in the output currents JI, JII at the push-pull outputs AI, AII of the amplifier. An amplifier of this type is described, for example, in U.S. patent application, Ser. No. 07/352 546 (now U.S. Pat. No. 4,931,746, issued Jun. 5, 1990). The output currents JI, JII are composed of constant quiescent current components $J_O$ and signal current components RF, $\overline{RF}$ representing the amplified input signal rf. The signal current components RF and $\overline{RF}$ are in phase opposition to one another. A current divider DI or DII is provided for each of the two output currents JI, JII in a dividing stage. The current dividers can be made up of identical resistors RD as in FIG. 2, but can also contain differential amplifiers for uniform current division.

A further advantageous embodiment provides for division such that each of the two signal branches of the differential amplifier contains two identical transistors, connected at base and emitter, with separate collectors. An array of this type leads in a simple way to a dependable equal division.

The mixers MI, MQ are designed as so-called Gilbert mixers (four-quadrant multipliers, double-balanced mixers) and preferably operated in switching mode by the signals TI, TQ. In the mixer output signals, signal components are then already largely suppressed at the frequency of the heterodyne signals.

The particular advantage of the array according to FIG. 6 is that, thanks to the cascading of the parallel-arranged mixers MI, MQ with a common voltage/current converter stage, the current sum $2J_O$ of the two operating currents $J_O$ flowing through the mixers is available in the voltage/current converter stage, and better properties of the partly opposing requirements of high linearity and low power consumption are combined. In addition, amplitude matching is achieved in a simple manner in the I and Q channel.

The cascading of an amplifier, preferably a controllable differential amplifier, with a mixer is generally advantageous thanks to the favourable properties as regards current consumption and linearity and thanks to the simple and dependable amplitude matching.

Figure 7B:
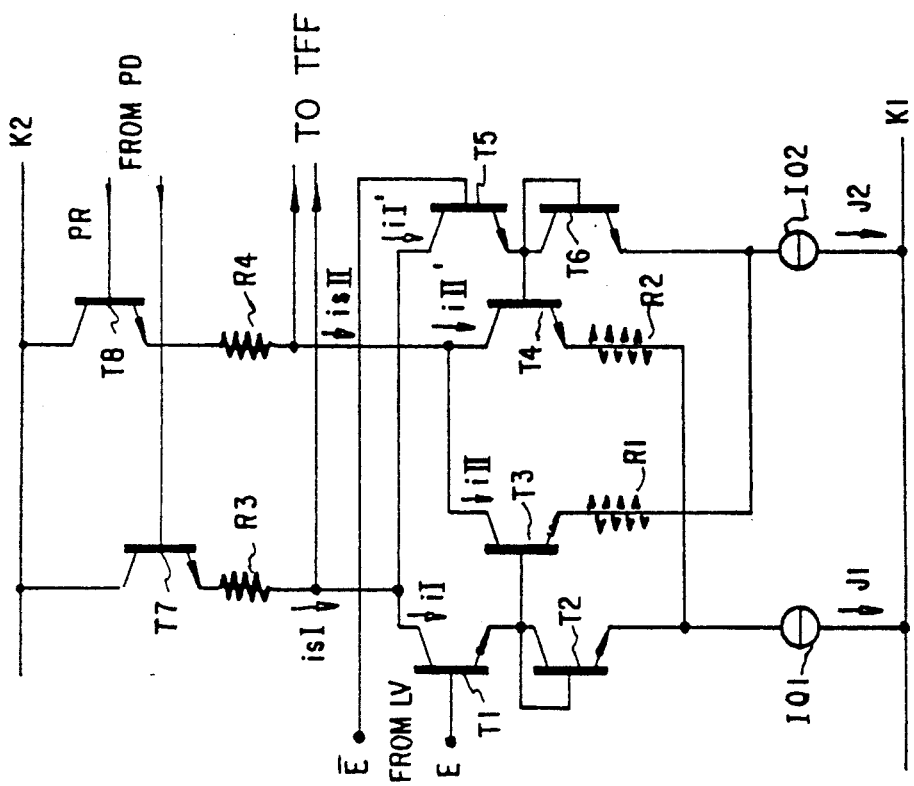
FIGS. 7(a) and 7(b) show embodiments of a frequency doubling stage.
Figure 7A:
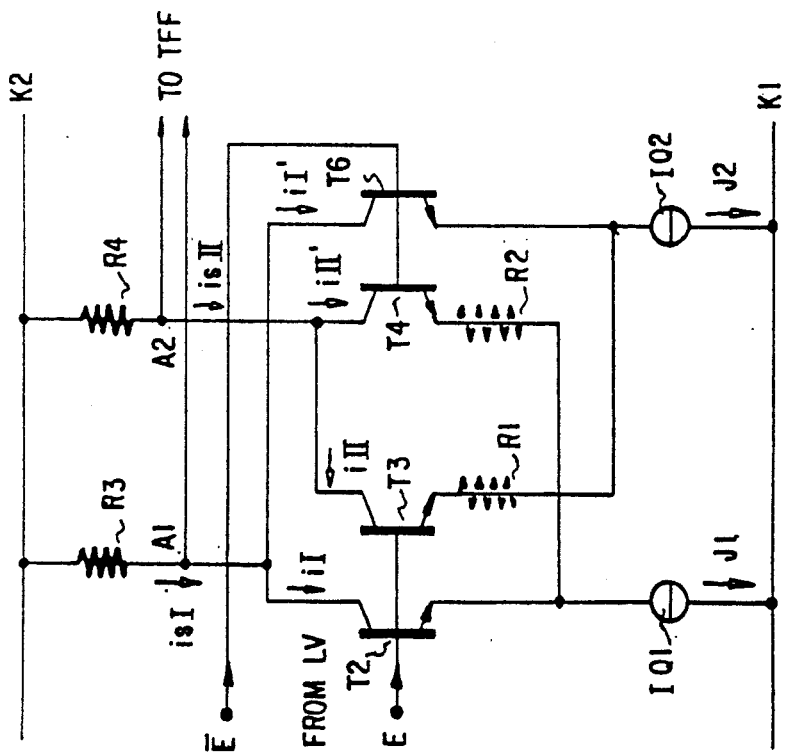

FIGS. 7(a) and 7(b) show two versions for the design of a frequency doubling stage. In the FIG. 7 (a) version, the stipulated currents J1 and J2 from the current sources IQ1 and IQ2 are divided up in accordance with the different emitter surface dimensions of transistors T2 and T4 for source IQ1 and transistors T6 and T3 for source IQ2 when the inputs E, $\overline{E}$ are balanced, i.e. are at the same DC voltage potential. The emitter surfaces are so dimensioned that considerably higher currents flow through transistors T2 and T6 than through transistors T4 and T3 respectively. The unequal current division can come about also by differing negative feedback of transistors T2 and T4 or T3 and T6 with equally dimensioned emitter surfaces instead of by different emitter surface dimensions. In the figure, this is indicated by the negative-feedback resistors R1, R2 drawn with broken lines. The transistors T2 and T4 and the transistors T6 and T3 each form a differential amplifier with uneven quiescent current division.

In the case of AC voltage operation of the inputs E, $\overline{E}$, the current division is altered in time with the change signal. On account of the clear unevenness of the quiescent current division as set in the quiescent condition, however, in the case of AC voltage operation only the current redistribution by the transistors with larger emitter surface (or lower negative feedback) T2 or T6 onto the transistors with smaller emitter surface (or higher negative feedback R1, R2) T3 or T4 is of significance as regards quantity. Each half-wave of the input signal at E, $\overline{E}$, causes a current redistribution from one of the paths (T2, T6) initially carrying more current to one initially carrying less current (T3, T4), so that a complementary rise and fall takes place in the output sum currents isI=iI+iI' and isII=iII+iII', with double the frequency compared with the input signal. From the voltage drop at the load resistors R3 and R4 is thus obtained a change signal at the output connection points A1, A2, said change signal having double the frequency of the input signal and being used to operate the toggle flip-flop FF (FIGS. 3, 4, 5).

The preferred embodiment of the frequency doubling circuit shown in FIG. 7 (b) differs from that previously described mainly by the additional transistors T1, T5, T7 and T8. The transistors T1 and T5 have the effect of increasing the input impedance. The DC voltage levels can be set at A1 and A2 using the transistors T7, T8 inserted in the output sum current paths in collector-base connection. The transistors T7, T8 therefore form an advantageous embodiment of the addition stages drawn in FIG. 5. When the bases of the transistors T7, T8 are operated by a control signal PR generated in the phase detector PD (FIGS. 2, 3), it is thus possible to achieve an adjustment of the 90° phase shift in the output signals TI, TQ of the toggle flip-flop TFF by a DC voltage shift of the frequency-doubled signal. The adjustment of the 90° phase position of the flip-flop output signals using a DC voltage shift of the flip-flop input signal is feasible in the same way without the special frequency-doubling array.

Particular advantages of the frequency-doubling circuit described are:
good dynamic characteristics;
symmetrical output;
high amplitude translation factor $k=A_{2f}/A_f$ with relatively low current consumption; and
operation with symmetrical or asymmetrical input signal possible.

Figure 8A:
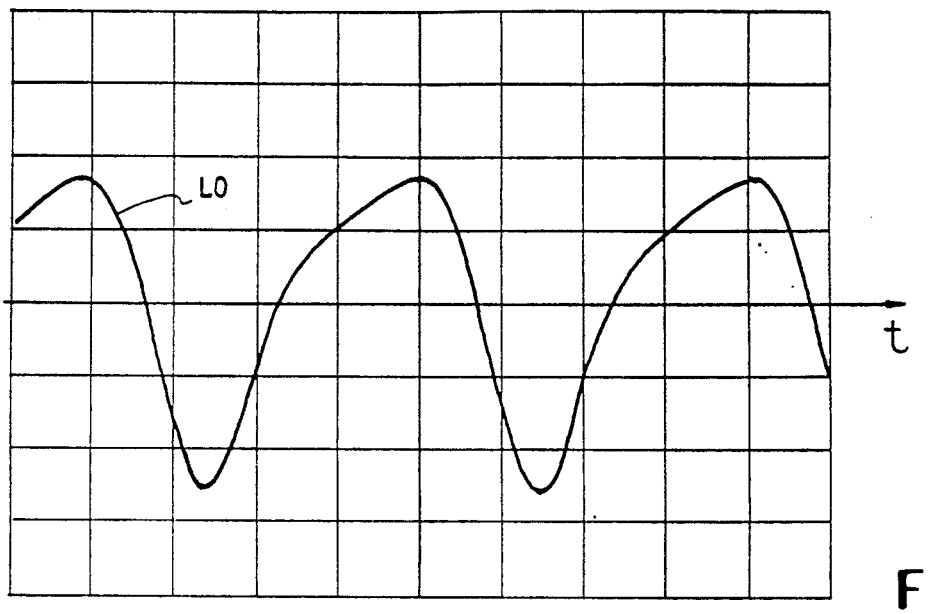
FIGS. 8(a) and 8(b) show a distorted oscillator signal and a spectral distribution of amplitude conditions, respectively.
Figure 8B:
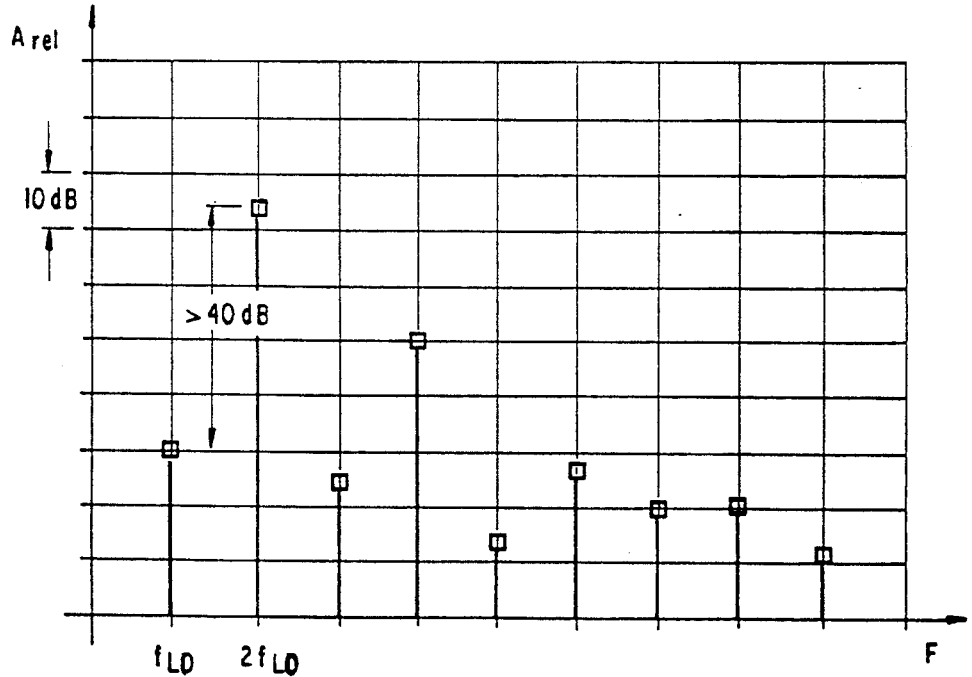

In. FIGS. 8(a) and 8(b) the properties of the frequency-doubling circuit FD in conjunction with the amplifier array LV adjusted to a keying ratio 0.5 are are shown. Even with a considerably distorted oscillator signal as depicted in FIG. 8 (a), the output signal of the frequency-doubling circuit (the spectral response of which is plotted in FIG. 8 (b) as relative amplitudes (Arel) with respect to the frequency f) has a high fundamental wave suppression, with an amplitude interval of more than 40 dB between the fundamental wave at $f_{LO}$ and the doubled frequency $2f_{LO}$. The signal components at $f=4f_{LO}$ always distort the frequency-doubled signal in the same direction and therefore do not lead to any interference during subsequent frequency division with phase control to generate orthogonal signals.

For the specifically described frequency doubling circuit, triggering signals E, $\overline{E}$ with low edge steepness (such as unclipped or slightly clipped signals) are advantageous, whereas for keying ratio adjustment of the amplifier LV, clipped (output) signals are an advantage.

The connection of the output of the amplifier LV to the input of the frequency-doubling stage therefore preferably has a low-pass character. For high frequencies, a low-pass response of this type is already achieved in sufficient measure by the dynamic properties of the actual components used. For lower frequencies, a low-pass filter is advantageously provided between the amplifier LV and the frequency-doubling stage FD, said filter also being settable for particularly wide operating frequency ranges, e.g. by means of voltage-controlled capacitance diodes. At the outputs of the frequency-doubling stages, the load resistors R3, R4 also form, together with the collector capacitances of the transistors, low-pass filters that damp signal components at frequencies of $3f_{LO}$ and higher more strongly than the useful output signal at $2f_{LO}$.

Figure 9:
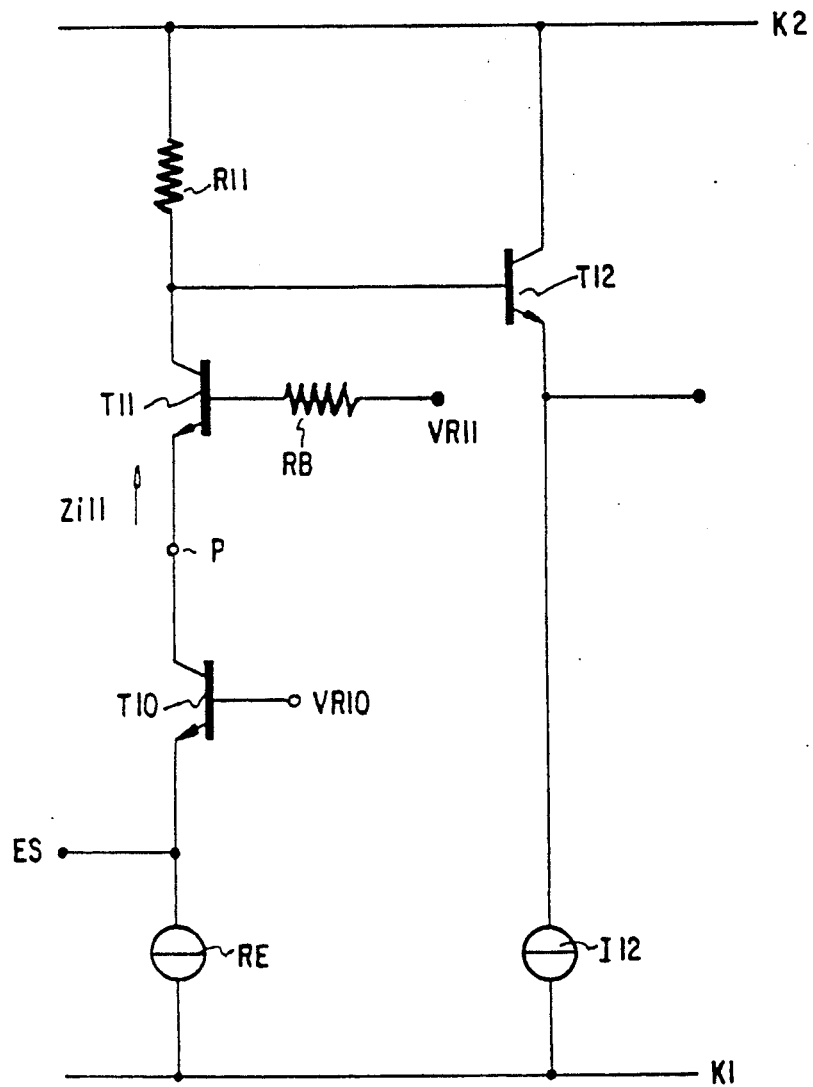
FIG. 9 shows a preferred embodiment of a preamplifier.

The circuit shown in FIG. 9 of a pre-amplifier for a receiver array as in FIG. 2 essentially comprises two series-connected transistors T10 and T11 in base connection. The emitter of T10 is connected to the signal input ES, and, via an impedance RE determining the quiescent current, to one terminal K1 of the supply voltage. The collector of T11 is connected to a decoupling stage and, via a load resistor R11, to the other terminal K2 of the supply voltage. In the example, an emitter follower formed by transistor T12 and the current source I12 is selected as the decoupling stage. Other versions for signal decoupling, e.g. open-collector decoupling at T11 with the use of an external load, are also possible and known per se. The bases of T10 and T11 are at constant potentials VR10 and VR11 respectively.

The transistors T10, T11 are designed unequal such that a substantially larger surface structure has been selected for transistor T10 than for transistor T11. The result is the combination of a low-noise input stage T10 with a small output stage T11, with a correspondingly higher cut-off frequency. Since the input impedance $Z_{i11}$ of T11 has an inductive character and is quantitatively dependent on the base path resistance of T11 or on an additional base resistor $R_B$, it is possible, in conjunction, with the capacitances effective at the connection point P and by the selection of the surface ratios of T10 and T11, to achieve a rise in the amplification (peaking), in particular for very high frequencies.

If the pre-amplifier is designed as a monolithically integrated circuit, it is furthermore possible to achieve a very good backward isolation, since in an integrated bipolar transistor there is no parasitic capacitance between collector and emitter and with a low-ohmic base (large structure) there is no crosstalk signal path between the collector and emitter in T10. This is advantageously helped by high-frequency earthing of the base of T10. The high backward isolation ensures stable operation within wide limits (unilateral amplifier) even with unadapted input and/or output gates.

The above components, described using the example of a direct-translating receiver, are not restricted to this form of employment, but can also be used singly elsewhere.

We claim:
1. A circuit array for frequency translation of an input signal using the principle of quadrature signal processing, comprising:
first mixer means for mixing a first portion of the input signal with a first quadrature heterodyne signal;

second mixer means for mixing a second portion of the input signal with a second quadrature heterodyne signal which is shifted 90° in phase with respect to the first quadrature heterodyne signal; and heterodyne signal generator means for generating the first and second quadrature heterodyne signals, the heterodyne signal generator means including a first portion which is connected to the first and second mixer means and a second portion which is connected to the first portion and which receives a local oscillator signal, the first portion of the heterodyne signal generator means having a first control loop means for stabilizing the 90° phase shift between the first and second quadrature heterodyne signals, wherein the second portion of the heterodyne signal generator means includes amplifier means for generating an amplified local oscillator signal, the amplified local oscillator signal having a keying ratio, and means for adjusting the keying ratio to 0.5, the means for adjusting having a second control loop which includes a symmetry detector, the amplified local oscillator signal being conveyed to the first portion of the heterodyne signal generator means.

2. The circuit array of claim 1, wherein the amplifier means comprises a limiting amplifier.

3. The circuit array of claim 1, wherein the input signal is a high-frequency signal, and the first and second portions of the input signal have the same phase.

4. A circuit array for frequency translation of an input signal using the principle of quadrature signal processing, comprising:

first mixer means for mixing a first portion of the input signal with a first quadrature heterodyne signal;

second mixer means for mixing a second portion of the input signal with a second quadrature heterodyne signal which is shifted 90° in phase with respect to the first quadrature heterodyne signal; and heterodyne signal generator means for generating the first and second quadrature heterodyne signals, the heterodyne signal generator means including a first portion which is connected to the first and second mixer means and a second portion which is connected to the first portion and which receives a local oscillator signal, the first portion of the heterodyne signal generator means having a first control loop means for stabilizing the 90° phase shift between the first and second quadrature heterodyne signals, wherein the first portion of the heterodyne signal generator means includes a frequency doubler to double the frequency of the local oscillator signal, and a master-slave D flip-flop in series with the frequency doubler, the flip-flop having a master stage with an output that supplies one of the quadrature heterodyne signals and having a slave stage with an output port that supplies the other of the quadrature heterodyne signals, and wherein the first control loop means includes a phase detector to detect the relative phases of the quadrature heterodyne signals.

5. The circuit array of claim 4, wherein the first portion of the heterodyne signal generator means further comprises first switch means for operating the master stage and second switch means for operating the slave stage, the first and second switch means having input ports that are responsive to output signals from the frequency doubler, and wherein the first control loop means adjusts the switching points of the first and second switch means so that they switch at a keying ratio of 0.5 by affecting the DC voltage levels at the input ports of the first and second switch means.

6. The circuit array of claim 5, wherein the phase detector comprises a third switch means having the same switching properties as the first and second switch means and having input ports that are connected to the input ports of the first and second switch means.

7. The circuit array of claim 6, wherein the third switch means has output ports, and wherein the phase detector further comprises means for low-pass filtering signals at the output ports of the third switch means, and evaluation means, responsive to the filtered signals, for determining the relative position in time of the switching points of the first, second, and third switch means.

8. The circuit array of claim 4, wherein the input signal is a baseband signal having first and second orthogonal components, the first portion of the input signal being the first orthogonal component and the second portion of the input signal being the second orthogonal component.

9. A circuit array for frequency translation of a high frequency input signal using the principle of quadrature signal processing, in combination with means connected to a receiving antenna for generating the input signal, wherein the circuit array for frequency translation of the input signal includes first mixer means for mixing a first portion of the input signal with a first quadrature heterodyne signal, second mixer means for mixing a second portion of the input signal with a second quadrature heterodyne signal which is shifted 90° in phase with respect to the first quadrature heterodyne signal, and heterodyne signal generator means for generating the first and second quadrature heterodyne signals, the heterodyne signal generator means including a first portion which is connected to the first and second mixer means and a second portion which is connected to the first portion and which receives a local oscillator signal, the first portion of the heterodyne signal generator means having a first control loop means for stabilizing the 90° phase shift between the first and second quadrature heterodyne signals, and wherein the means connected to the receiving antenna includes a preamplifier, means responsive to the preamplifier for generating the first and second portions of the input signal, the means responsive to the preamplifier including a voltage/current converter having a controllable amplification factor, the voltage/current converter receiving the input signal from the preamplifier and providing an output current, and divider means for supplying the output current of the voltage/current converter in equal parts to the first and second mixer means.

10. The combination of claim 9, wherein the preamplifier comprises an input base stage having a first transistor and an output base stage having a second transistor, the input and output base stages being connected in series, the first transistor of the input base stage being larger than the second transistor of the output base stage.

11. The circuit array of claim 1, wherein the circuit array comprises a monolithic integrated circuit.

* * * * *